United States Patent
Okabe

(10) Patent No.: US 9,711,563 B2
(45) Date of Patent: Jul. 18, 2017

(54) METHOD OF MANUFACTURING SEMICONDUCTOR DEVICE HAVING AN INSULATING FILM IN TRENCHES OF A SEMICONDUCTOR SUBSTRATE

(71) Applicant: CANON KABUSHIKI KAISHA, Tokyo (JP)

(72) Inventor: Takehito Okabe, Atsugi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/645,592

(22) Filed: Mar. 12, 2015

(65) Prior Publication Data
US 2015/0270309 A1    Sep. 24, 2015

(30) Foreign Application Priority Data

Mar. 20, 2014 (JP) .................................. 2014-059077

(51) Int. Cl.
*H01L 21/00* (2006.01)
*H01L 27/146* (2006.01)

(52) U.S. Cl.
CPC .... *H01L 27/14689* (2013.01); *H01L 27/1463* (2013.01)

(58) Field of Classification Search
CPC ..................... H01L 27/14689; H01L 27/1463
USPC .................... 438/73, 691, 703, 759
See application file for complete search history.

(56) References Cited

U.S. PATENT DOCUMENTS

| 7,355,158 B2 | 4/2008 | Inoue et al. |
| 7,482,570 B2 | 1/2009 | Inoue et al. |
| 8,703,577 B1* | 4/2014 | Zhu ..................... H01L 21/3081 257/501 |
| 2004/0135198 A1* | 7/2004 | Murahama ........ H01L 21/76232 257/330 |
| 2007/0087518 A1 | 4/2007 | Ochi et al. |
| 2009/0124036 A1* | 5/2009 | Ohtsuka ............ H01L 21/76224 438/57 |
| 2012/0002070 A1* | 1/2012 | Akiyama .......... H01L 27/14614 348/222.1 |

(Continued)

FOREIGN PATENT DOCUMENTS

| JP | 2003-142674 A | 5/2003 |
| JP | 2007-109966 A | 4/2007 |

(Continued)

*Primary Examiner* — Phat X Cao
*Assistant Examiner* — Mohammad M Hoque
(74) *Attorney, Agent, or Firm* — Fitzpatrick, Cella, Harper & Scinto

(57) ABSTRACT

A method of manufacturing a semiconductor device includes forming, over a semiconductor substrate comprising a first region and a second region, a patterned first film in which an upper face of a portion located over the first region is positioned at a lower height from the semiconductor substrate than an upper face of a portion located over the second region, forming, over the first film, a second film which is an insulating film, a portion of the second film penetrating the first film and being located inside a trench of the semiconductor substrate, and polishing the second film to remove a portion of the second film located over the first film. An occupancy of the trench in the first region is lower than an occupancy of the trench in the second region.

12 Claims, 4 Drawing Sheets

(56) References Cited

U.S. PATENT DOCUMENTS

2013/0034949 A1* 2/2013 Kao .................. H01L 21/76229
438/427
2015/0115337 A1* 4/2015 Yang ................. H01L 27/14643
257/292

FOREIGN PATENT DOCUMENTS

JP  2007-207828 A  8/2007
JP  2009-117681 A  5/2009

* cited by examiner

METHOD OF MANUFACTURING SEMICONDUCTOR DEVICE HAVING AN INSULATING FILM IN TRENCHES OF A SEMICONDUCTOR SUBSTRATE

BACKGROUND OF THE INVENTION

Field of the Invention

The present invention relates to a method of manufacturing a semiconductor device.

Description of the Related Art

Photoelectric conversion regions and transistors for processing signals therefrom are being more and more miniaturized in photoelectric conversion devices (e.g., CMOS image sensors) used for digital cameras or video cameras or the like. Japanese Patent Laid-Open No. 2003-142674 forms an element isolation region using not a conventional LOCOS method but an STI method for such miniaturization.

SUMMARY OF THE INVENTION

With advances in the miniaturization of a pixel region in photoelectric conversion devices, an occupancy (area occupancy) of a light-receiving region in the pixel region is increasing. As a result, in the photoelectric conversion devices, an occupancy of an element isolation region in the pixel region is different from an occupancy of an element isolation region in a peripheral circuit region. When an element isolation region is formed using the STI method, this occupancy difference may lead to a variation in the height of the isolation insulating film embedded in a trench. When there is a variation in the height of the isolation insulating film, it is difficult to contain the height of the isolation insulating film within an appropriate range. A variation in the height of the isolation insulating film may occur not only in photoelectric conversion devices but also in general semiconductor devices. An aspect of the present invention provides a technique for reducing a variation in the height of an STI-type isolation insulating film in a semiconductor device.

According to some embodiments, a method of manufacturing a semiconductor device, comprises: forming, over a semiconductor substrate comprising a first region and a second region, a patterned first film having a first part located over the first region and a second part located over the second region, an upper face of the first part being positioned at a lower height from the semiconductor substrate than an upper face of the second part; forming, over the first film, a second film which is an insulating film, a portion of the second film penetrating the first part and being located inside a trench of the first region, and a portion of the second film penetrating the second part and being located inside a trench of the second region; and polishing the second film to remove a portion of the second film located over the first film. An occupancy of the trench in the first region is lower than an occupancy of the trench in the second region.

According to some other embodiments, a method of manufacturing a semiconductor device comprises: forming, over a semiconductor substrate comprising a first region and a second region, a patterned first film; forming, over the first film, a second film which is an insulating film, a portion of the second film penetrating the first film and being located inside a trench of the semiconductor substrate; polishing the second film to remove a portion of the second film located over the first film; and after polishing the second film, processing the second film so as to reduce a difference between a height of an upper face of the second film located over the first region from the semiconductor substrate and a height of an upper face of the second film located over the second region from the semiconductor substrate. An occupancy of the trench in the first region is lower than an occupancy of the trench in the second region. Before processing the second film, an upper face of the second film located over the first region is positioned at a higher height from the semiconductor substrate than an upper face of the second film located over the second region.

According to some other embodiments, a method of manufacturing a semiconductor device comprises: forming, over a semiconductor substrate comprising a first region and a second region, a patterned first film; forming, over the first film, a second film which is an insulating film, a portion of the second film penetrating the first film and being located inside a trench of the semiconductor substrate; and polishing the second film to remove a portion of the second film located over the first film. An occupancy of the trench in the first region is lower than an occupancy of the trench in the second region. In the forming of the second film, the second film is formed so that an upper face of the second film located over the first region is positioned at a lower height from the semiconductor substrate than an upper face of the second film located over the second region. The polishing of the second film is performed until an upper face of the second film located over the first region is positioned at a same height from the semiconductor substrate as an upper face of the second film located over the second region.

Further features of the present invention will become apparent from the following description of exemplary embodiments (with reference to the attached drawings).

DESCRIPTION OF THE EMBODIMENTS

Figure 1:
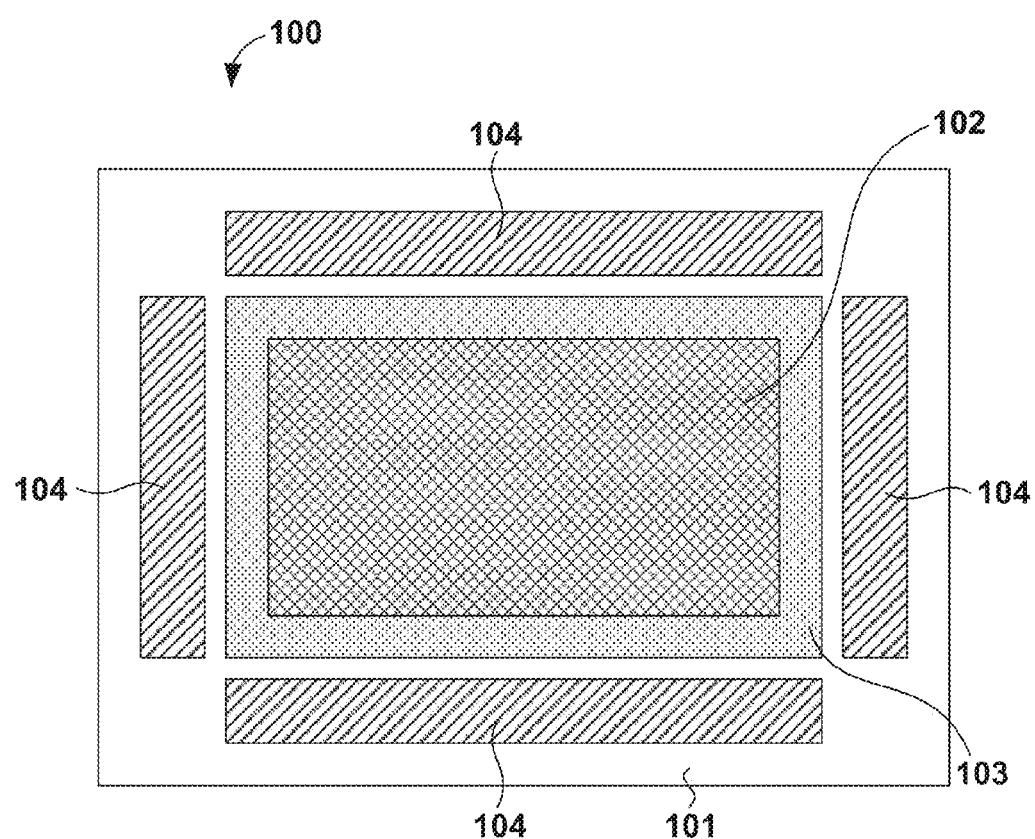
FIG. 1 is a plan view describing a structure of a photoelectric conversion device according to an embodiment.

Hereinafter, embodiments of the present invention will be described with reference to the accompanying drawings. Common elements among various embodiments are assigned identical reference numerals and overlapping description will be omitted. The embodiments may be changed or combined as appropriate. The present invention is applicable to any given semiconductor device having an STI-type isolation insulating film. Hereinafter, a photoelectric conversion device will be described as an example of such a semiconductor device.

A configuration example of a photoelectric conversion device 100 according to an embodiment will be described with reference to a plan view in FIG. 1. The photoelectric conversion device 100 includes a pixel region 102 and peripheral circuit regions 104 arranged therearound provided on a semiconductor substrate 101. The semiconductor substrate 101 is formed of silicon, for example. The pixel region 102 refers to a region in which pixels including a photoelectric conversion element and a circuit element such as a transistor for transferring charge generated in the photoelectric conversion element are arranged in an array. The pixel region 102 is formed inside an impurity semiconductor region 103 formed on the semiconductor substrate 101. The impurity semiconductor region 103 is also called a "well region." The peripheral circuit regions 104 refer to regions in which a circuit for driving the circuit element of the pixel region 102 and a circuit for processing a signal from the pixel region 102 or the like are formed.

The occupancy of the element isolation region in the pixel region 102 is lower than the occupancy of the element isolation region in the peripheral circuit region 104. In the impurity semiconductor region 103, there is also a wide active region in a region other than the pixel region 102, and so the occupancy of the element isolation region in the impurity semiconductor region 103 is also lower than the occupancy of the element isolation region in the peripheral circuit region 104.

The occupancy of the element isolation region in each region of the semiconductor substrate 101 is defined, for example, by the occupancy of the area of the element isolation region on the surface (main surface) of the semiconductor substrate 101 to the area of the region on the surface of the semiconductor substrate 101. For example, the occupancy of the element isolation region in the impurity semiconductor region 103 can be obtained from an orthographic view in which an outer edge of the element isolation region and an outer edge of the impurity semiconductor region 103 are orthographically projected onto the surface of the semiconductor substrate 101. For example, the outer edge of the element isolation region and the outer edge of the impurity semiconductor region 103 can also be obtained from the cross section of the photoelectric conversion device. If the element isolation region in each region is divided into a plurality of portions, the occupancy of the element isolation regions in the impurity semiconductor region 103 is defined by the occupancy of the total area of the plurality of element isolation regions. A dummy active region may also be provided in the peripheral circuit regions 104 so as to reduce a difference between the occupancy of the element isolation region in the pixel region 102 or impurity semiconductor region 103 and the occupancy of the element isolation region in the peripheral circuit regions 104. That is, no element isolation region may be formed in part of the region of the peripheral circuit region 104 where no circuit element is formed.

Next, an example of the method of manufacturing the photoelectric conversion device 100 will be described with reference to FIGS. 2A to 2G. FIGS. 2A to 2G each illustrate a cross section of a structure formed in each step of the photoelectric conversion device 100. The semiconductor substrate 101 includes a region 101a and a region 101b. The occupancy of the element isolation region in the region 101a is lower than the occupancy of the element isolation region in the region 101b. The region 101a includes, for example, the pixel region 102 and the impurity semiconductor region 103. The region 101b includes, for example, the peripheral circuit regions 104.

Figure 2A:
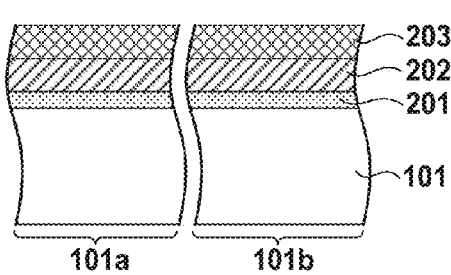
FIGS. 2A to 2G are cross-sectional views describing an example of a method of manufacturing the photoelectric conversion device in FIG. 1.

First, as shown in FIG. 2A, a silicon oxide film 201, a polysilicon film 202 and a silicon nitride film 203 are formed in that order on the surface (main surface) of the semiconductor substrate 101. The surface of this semiconductor substrate 101 is assumed to be an upper face. The silicon oxide film 201 is formed by, for example, thermally oxidizing silicon of the semiconductor substrate 101. The polysilicon film 202 and the silicon nitride film 203 are formed using, for example, a CVD method.

Next, a resist pattern 204 is formed by photolithography which covers a portion of the silicon nitride film 203 located over the region 101b of the semiconductor substrate 101 and exposes a portion of the silicon nitride film 203 located over the region 101a of the semiconductor substrate 101. The thickness of the portion of the silicon nitride film 203 located over the region 101a of the semiconductor substrate 101 is reduced by etching the silicon nitride film 203 using this resist pattern 204 as a mask. This etching is dry etching, for example. A structure shown in FIG. 2B is formed in this way. In this structure, a height 203a of the upper face of the portion of the silicon nitride film 203 located over the region 101a from the semiconductor substrate 101 is lower than a height 203b of the upper face of the portion of the silicon nitride film 203 located over the region 101b from the semiconductor substrate 101. After this, the resist pattern 204 is removed. The height from the semiconductor substrate 101 in the present specification refers to a height from the upper face of the semiconductor substrate 101.

Next, a resist pattern 205 is formed by photolithography which covers the portion of the silicon nitride film 203 located over an active region and exposes the portion of the silicon nitride film 203 located over an element isolation region. A trench 206 is formed in the semiconductor substrate 101 by etching the silicon nitride film 203, polysilicon film 202, silicon oxide film 201 and semiconductor substrate 101 in that order using the resist pattern 205 as a mask. The trench 206 is formed up to a predetermined depth in a portion of the semiconductor substrate 101 to be the element isolation region. This etching is dry etching, for example. A structure shown in FIG. 2C is formed in this way. After that, the resist pattern 205 is removed. Since the occupancy of the element isolation region in the region 101a is lower than the occupancy of the element isolation region in the region 101b, the occupancy of the trench 206 in the first region 101a is lower than the occupancy of the trench 206 in the second region 101b. Here, since the semiconductor substrate 101 includes the trench 206, the upper face of the semiconductor substrate 101 has a concave part. However, for simplicity in the following description, suppose that the upper face of the semiconductor substrate 101 refers to a portion other than the trench 206 and the height from the semiconductor substrate 101 refers to the height from the surface including the upper face of the semiconductor substrate 101 other than the trench 206.

Figure 2E:
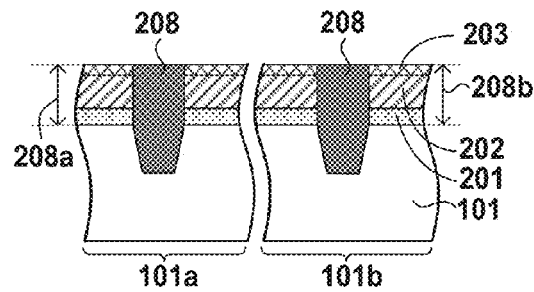
Figure 2B:
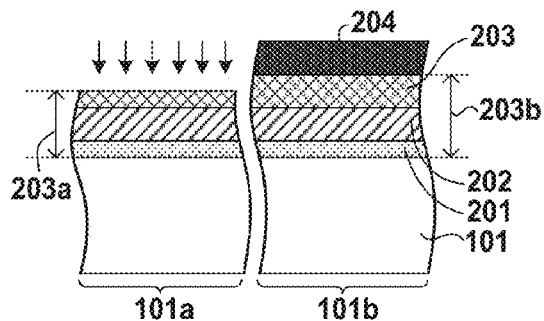
Figure 2F:
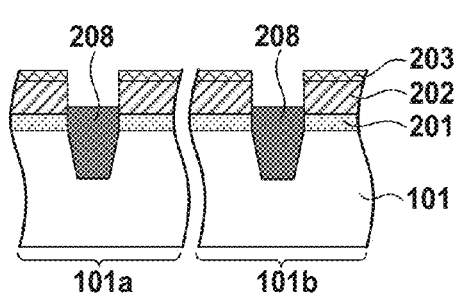
Figure 2C:
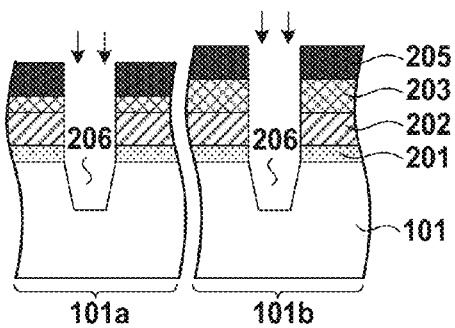
Figure 2G:
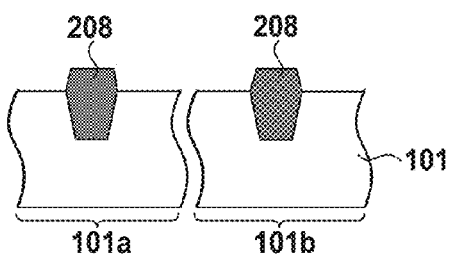
Figure 2D:
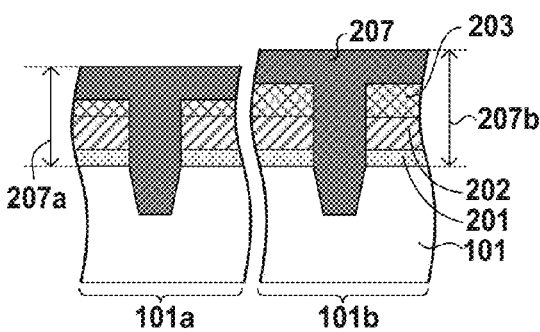

Next, as shown in FIG. 2D, a silicon oxide film 207 is formed. Part of the silicon oxide film 207 is located inside the trench 206 penetrating the silicon oxide film 201, polysilicon film 202 and silicon nitride film 203, and part of the rest of the silicon oxide film 207 is located on the silicon nitride film 203. The silicon oxide film 207 is formed by, for example, thermally oxidizing a side wall of the trench 206 of the semiconductor substrate 101, and further depositing silicon oxide using CVD. In this structure, a height 207a of the upper face of the portion of the silicon oxide film 207 located over the region 101a from the semiconductor substrate 101 is lower than a height 207b of the upper face of the portion of the silicon oxide film 207 located over the region 101b from the semiconductor substrate 101.

Next, as shown in FIG. 2E, the portion of the silicon oxide film 207 located over the silicon nitride film 203 is removed by polishing the silicon oxide film 207 using a CMP method. The portion of the silicon oxide film 207 that remains after the polishing becomes an isolation insulating film 208. Before performing this CMP method, the silicon oxide film 207 may be etched back to reduce the thickness of the silicon oxide film 207. The silicon nitride film 203 functions as a polishing stopper film which is exposed through this polishing. After the polishing, a height 208a of the upper face of the isolation insulating film 208 in the region 101a from the semiconductor substrate 101 is equal to a height 208b of the upper face of the isolation insulating film 208 in the region 101b from the semiconductor substrate 101.

Next, as shown in FIG. 2F, the height of the isolation insulating film 208 is adjusted by etching. Next, as shown in FIG. 2G, unnecessary portions of the silicon nitride film 203, polysilicon film 202 and silicon oxide film 201 are removed respectively. Part of the silicon oxide film 201 may be left without being removed to protect the semiconductor substrate 101 from damage by ion implantation when forming a diffusion layer.

An STI-type isolation insulating film 208 is formed in the element isolation region of the semiconductor substrate 101 in this way. After that, necessary processing is done and the photoelectric conversion device 100 is completed. In this photoelectric conversion device 100, the height of the isolation insulating film 208 in the region 101a is equal to the height of the isolation insulating film 208 in the region 101b. The height of this isolation insulating film 208 may also be called the amount of protrusion from the upper face of the semiconductor substrate 101. In FIG. 2B, the amount of reducing the thickness of the portion of the silicon nitride film 203 located over the region 101a of the semiconductor substrate 101 is determined so that the heights of the isolation insulating films 208 become equal.

A case in the aforementioned embodiment will be examined where the thickness of the portion of the silicon nitride film 203 located over the region 101a of the semiconductor substrate 101 has not been reduced. In this case, the height 207a of the silicon oxide film 207 in the region 101a before the polishing becomes equal to the height 207b in the region 101b. For this reason, because of a difference in the occupancy of the element isolation region, in the isolation insulating film 208 obtained after the polishing, the height 208a in the region 101a is higher than the height 208b in the region 101b. When the height of the isolation insulating film 208 is excessively high, in etching of a polysilicon film for forming a gate electrode in subsequent steps, residues of polysilicon may remain on the side wall of the protruding portion of the isolation insulating film 208, causing a short-circuit. Conversely when the height of the isolation insulating film 208 is excessively low, this may cause an increase in leakage current. In the present embodiment, it is possible to reduce a variation in the height of the isolation insulating film 208 by processing the silicon nitride film 203 as described above, easily contain the height of the isolation insulating film 208 within an appropriate range and suppress the occurrence of short-circuit or an increase in leakage current.

Next, another example of the method of manufacturing the photoelectric conversion device 100 will be described with reference to FIGS. 3A to 3G. FIGS. 3A to 3G each illustrate a cross section of a structure formed in each step of the photoelectric conversion device 100. As in the case of the example described in FIGS. 2A to 2G, the occupancy of the element isolation region in the region 101a is lower than the occupancy of the element isolation region in the region 101b.

Figure 3A:
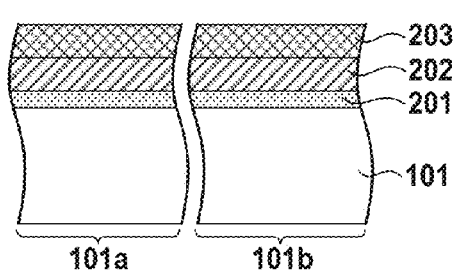
FIGS. 3A to 3G are cross-sectional views describing another example of the method of manufacturing the photoelectric conversion device in FIG. 1.
Figure 3E:
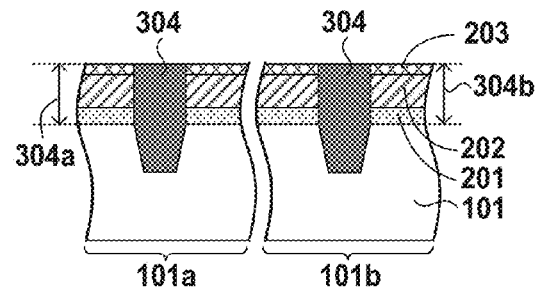

First, as shown in FIG. 3A, a silicon oxide film 201, a polysilicon film 202 and a silicon nitride film 203 are formed in that order on the semiconductor substrate 101 as in the case of FIG. 2A.

Figure 3B:
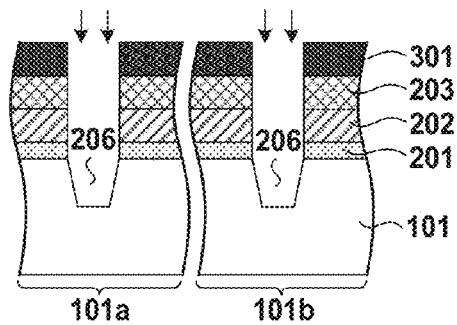

Next, a resist pattern 301 is formed by photolithography, which covers the portion of the silicon nitride film 203 located over the active region and exposes the portion of the silicon nitride film 203 located over the element isolation region. A trench 206 is formed by etching the silicon nitride film 203, polysilicon film 202, silicon oxide film 201 and semiconductor substrate 101 in that order using the resist pattern 301 as a mask. The trench 206 is formed up to a predetermined depth in a portion of the semiconductor substrate 101 to be the element isolation region. This etching is dry etching, for example. A structure shown in FIG. 3B is formed in this way. After that, the resist pattern 301 is removed.

Figure 3F:
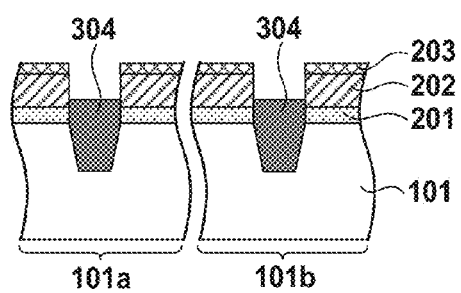
Figure 3C:
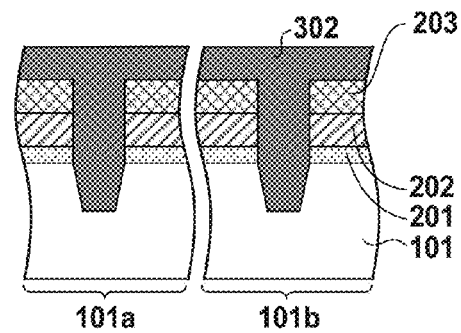

Next, as shown in FIG. 3C, a silicon oxide film 302 is formed. Part of the silicon oxide film 302 is located inside the trench 206 penetrating the silicon oxide film 201, polysilicon film 202 and silicon nitride film 203, and part of the rest of the silicon oxide film 302 is located on the silicon nitride film 203. The silicon oxide film 302 is formed by, for example, thermally oxidizing a side wall of the trench 206 of the semiconductor substrate 101, and further depositing silicon oxide using CVD.

Figure 3G:
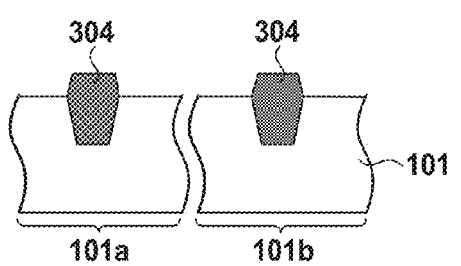
Figure 3D:
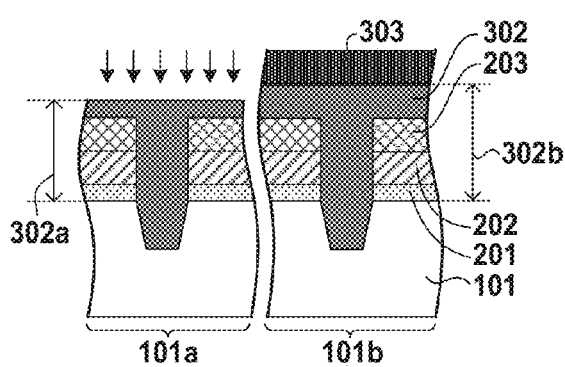

Next, a resist pattern 303 is formed by photolithography, which covers the portion of the silicon oxide film 302 located over the region 101b of the semiconductor substrate 101 and exposes the portion of the silicon oxide film 302 located over the region 101a of the semiconductor substrate 101. The thickness of the portion of the silicon oxide film 302 located over the region 101a of the semiconductor substrate 101 is reduced by etching the silicon oxide film 302 using this resist pattern 303 as a mask. This etching is dry etching, for example. A structure shown in FIG. 3D is formed in this way. In this structure, a height 302a of the upper face of the portion of the silicon oxide film 302 located over the region 101a from the semiconductor substrate 101 is lower than a height 302b of the upper face of the portion of the silicon oxide film 302 located over the region 101b from the semiconductor substrate 101. After this, the resist pattern 303 is removed.

Next, as shown in FIG. 3D, the portion of the silicon oxide film 302 located over the silicon nitride film 203 is removed by polishing the silicon oxide film 302 using a CMP method. The portion of the silicon oxide film 302 remaining after the polishing becomes an isolation insulating film 304. Before performing this CMP method, the silicon oxide film 302 may be etched back to reduce the thickness of the silicon oxide film 302. After the polishing, a height 304a of the upper face of the isolation insulating film 304 in the region 101a from the semiconductor substrate 101 becomes equal to a height 304b of the upper face of the isolation insulating film 304 in the region 101b from the semiconductor substrate 101.

Next, as shown in FIG. 3F, the height of the isolation insulating film 304 is adjusted by etching. Next, as shown in FIG. 3G, unnecessary portions of the silicon nitride film 203, polysilicon film 202 and silicon oxide film 201 are removed respectively. Part of the silicon oxide film 201 may be left without being removed to protect the semiconductor substrate 101 from damage by ion implantation when forming a diffusion layer.

An STI-type isolation insulating film 304 is formed in the element isolation region of the semiconductor substrate 101 in this way. After that, necessary processing is done and the photoelectric conversion device 100 is completed. In FIG. 3D, the amount of reduction in the thickness of the portion of the silicon oxide film 302 located over the region 101a of the semiconductor substrate 101 is determined such that heights of the respective isolation insulating films 304 become equal.

Next, still another example of the method of manufacturing the photoelectric conversion device 100 will be described with reference to FIGS. 4A to 4G. FIGS. 4A to 4G each illustrate a cross section of a structure formed in each step of the photoelectric conversion device 100. As in the case of the example described in FIGS. 2A to 2G, the occupancy of the element isolation region in the region 101a is lower than the occupancy of the element isolation region in the region 101b.

Figure 4A:
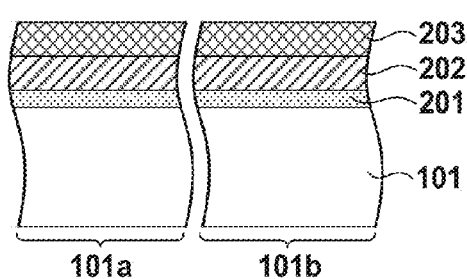
FIGS. 4A to 4G are cross-sectional views describing still another example of the method of manufacturing the photoelectric conversion device in FIG. 1.

First, as shown in FIG. 4A, a silicon oxide film 201, a polysilicon film 202 and a silicon nitride film 203 are formed in that order on the semiconductor substrate 101 as in the case of FIG. 2A. Next, as shown in FIG. 4B, a trench 206 is formed as in the case of FIG. 3B. Next, as shown in FIG. 4C, a silicon oxide film 302 is formed as in the case of FIG. 3C.

Figure 4E:
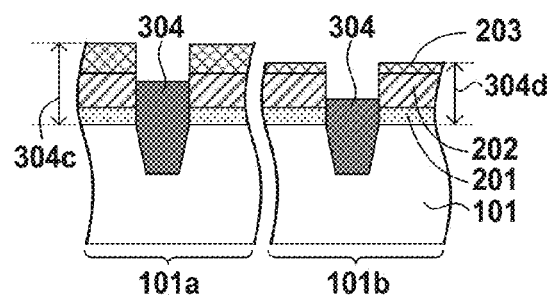
Figure 4B:
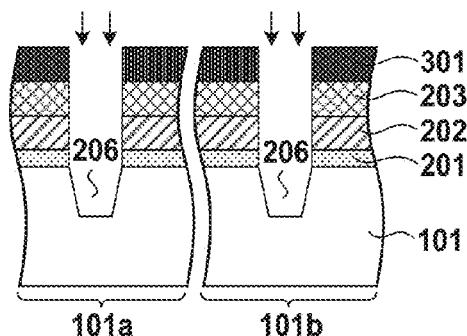
Figure 4F:
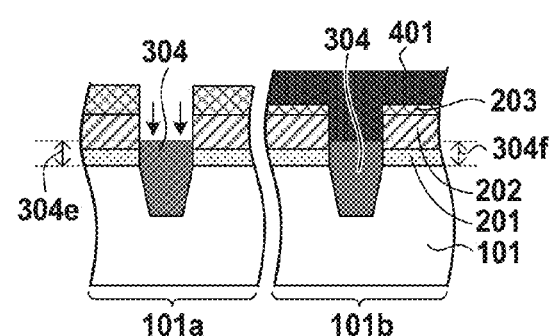
Figure 4C:
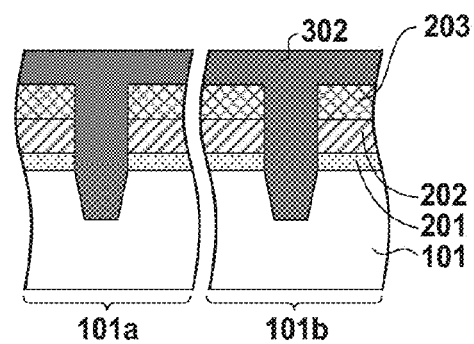
Figure 4G:
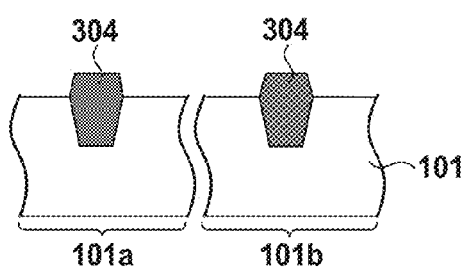
Figure 4D:
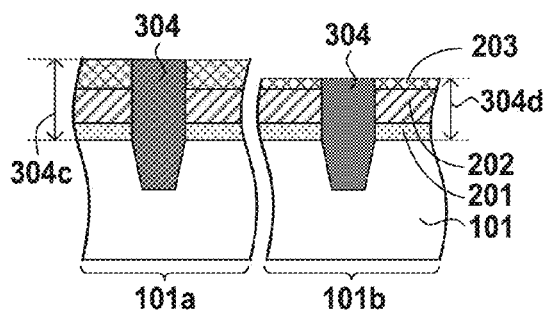

Next, as shown in FIG. 4D, the portion of the silicon oxide film 302 located over the silicon nitride film 203 is removed by polishing the silicon oxide film 302 using a CMP method. The portion of the silicon oxide film 302 remaining after the polishing becomes an isolation insulating film 304. Before performing this CMP method, the silicon oxide film 302 may be etched back to reduce the thickness of the silicon oxide film 302. Caused by a difference in density between the element isolation regions, after the polishing, a height 304c of the upper face of the isolation insulating film 304 in the region 101a from the semiconductor substrate 101 is higher than a height 304d of the upper face of the isolation insulating film 304 in the region 101b from the semiconductor substrate 101.

Next, as shown in FIG. 4E, the height of the isolation insulating film 304 is adjusted by etching. This etching is applied to both the isolation insulating film 304 in the region 101a and the isolation insulating film 304 in the region 101b.

Next, a resist pattern 401 is formed by photolithography, which covers the portion of the isolation insulating film 304 located over the region 101b of the semiconductor substrate 101 and exposes the portion of the isolation insulating film 304 located over the region 101a of the semiconductor substrate 101. The thickness of the isolation insulating film 304 located over the region 101a of the semiconductor substrate 101 is reduced by etching the isolation insulating film 304 using the resist pattern 401 as a mask. This etching is dry etching, for example. A structure shown in FIG. 3F is formed in this way. In this structure, a height 304e of the upper face of the isolation insulating film 304 in the region 101a from the semiconductor substrate 101 is equal to a height 304f of the upper face of the isolation insulating film 304 in the region 101b from the semiconductor substrate 101. After this, the resist pattern 401 is removed.

Next, as shown in FIG. 4G, unnecessary portions of the silicon nitride film 203, polysilicon film 202 and silicon oxide film 201 are removed respectively. Part of the silicon oxide film 201 may be left without being removed to protect the semiconductor substrate 101 from damage by ion implantation when forming a diffusion layer.

An STI-type isolation insulating film 304 is formed in the element isolation region of the semiconductor substrate 101 as described so far. After that, necessary processing is done and the photoelectric conversion device 100 is completed. In the manufacturing method in FIGS. 4A to 4G, it does not matter which of the step in FIG. 4E or the step in FIG. 4F is done first.

A variation in the height of the upper face of the isolation insulating film 208 or 304 from the semiconductor substrate 101 can be reduced using any one of the manufacturing methods in FIGS. 2A to 2G to FIGS. 4A to 4G. The photoelectric conversion device 100 may be manufactured by combining any manufacturing methods in FIGS. 2A to 2G to FIGS. 4A to 4G.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-059077, filed Mar. 20, 2014 which is hereby incorporated by reference herein in its entirety.

What is claimed is:

1. A method of manufacturing a semiconductor device, comprising:
    forming, over a semiconductor substrate comprising a first region and a second region, a first film having a first part located over the first region and a second part located over the second region;
    reducing a thickness of a portion of the first film located over the first region, so that an upper face of the first part is positioned at a lower height from the semiconductor substrate than an upper face of the second part, and so that a first difference in height from the semiconductor substrate between the upper face of the first part and the upper face of the second part is larger than a second difference in height from the semiconductor substrate between a lower face of the first part and a lower face of the second part;
    after forming the first film, forming one or more trenches in the first region penetrating the first part of the first film and reaching an inside of the substrate and one or more trenches in the second region penetrating the second part of the first film and reaching the inside of the substrate;
    forming, over the first film, a second film which is an insulating film, a portion of the second film passing through the one or more holes of the first part and being located inside the one or more trenches of the first region, and a portion of the second film being located inside the one or more trenches of the second region; and
    polishing the second film to remove a portion of the second film located over the first film, so that a third difference in height from the semiconductor substrate between the upper face of the first part and the upper face of the second part after the polishing is smaller than the first difference,
    wherein in the forming of the second film, the second film is formed so that the second film has a first portion located over the first region and a second portion located over the second region and an upper face of the first portion of the second film is positioned at a lower height from the semiconductor substrate than an upper face of the second portion of the second film.

2. The method according to claim 1, further comprising removing by etching, after the polishing of the second film, an upper portion of the second film located over the first region and an upper portion of the second film located over the second region.

3. The method according to claim 2, further comprising forming, before the forming of the first film, a polysilicon film over the semiconductor substrate, wherein an upper face of the second film remaining after the etching is positioned at a higher height from the semiconductor substrate than a lower face of the polysilicon film and is positioned at a lower height from the semiconductor substrate than an upper face of the polysilicon film.

4. The method according to claim 1, wherein the forming of the one or more trenches comprises:
   forming a first resist pattern that exposes a part of the first film located over the first region and covers a part of the first film located over the second region; and
   etching the first film using the first resist pattern as a mask.

5. The method according to claim 1, wherein the forming of the second film comprises processing the second film so that the second film has a first portion located over the first region and a second portion located over the second region and an upper face of the first portion of the second film is positioned at a lower height from the semiconductor substrate than an upper face of the second portion of the second film.

6. The manufacturing method according to claim 5, wherein the processing the second film comprises:
   forming a second resist pattern that exposes a portion of the second film located over the first region and covers a portion of the second film located over the second region; and
   etching the second film using the second resist pattern as a mask.

7. The method according to claim 1, wherein the semiconductor device is a photoelectric conversion device comprising a pixel region and a peripheral circuit region on the semiconductor substrate, and
   wherein the first region comprises the pixel region and the second region comprises the peripheral circuit region.

8. The method according to claim 7, wherein the pixel region is formed inside an impurity semiconductor region formed in the semiconductor substrate, and
   wherein the first region comprises the impurity semiconductor region.

9. The method according to claim 7, wherein the peripheral circuit region comprises a dummy active region.

10. The method according to claim 1, wherein the one or more trenches of the first region have the same depth from an upper face of the semiconductor substrate as the one or more trenches of the second region.

11. The method according to claim 1, wherein part of the second film located inside the one or more trenches configures an element isolation region.

12. The method according to claim 1, wherein the first difference is larger than a difference in depth from the semiconductor substrate between a first trench of the one or more trenches penetrating the first part of the first film and a second trench of the one or more trenches holes penetrating the second part of the first film.

* * * * *